US005451726A

United States Patent [19]

Haugum

[11] Patent Number: 5,451,726

[45] Date of Patent: Sep. 19, 1995

[54] OMNIDIRECTIONAL SPEAKER SYSTEM

[75] Inventor: Ted L. Haugum, Incline, Nev.

[73] Assignee: Eclipse Research Corporation, Incline Village, Nev.

[21] Appl. No.: 232,799

[22] Filed: Apr. 25, 1994

Related U.S. Application Data

[63] Continuation-in-part of Ser. No. 93,296, Jul. 16, 1993, Pat. No. 5,306,880, which is a continuation of Ser. No. 720,314, Jun. 25, 1991, abandoned.

[51] Int. Cl.[6] .............................................. H05K 5/00

[52] U.S. Cl. .................................. 181/150; 181/151; 181/153; 181/155

[58] Field of Search ............... 181/149, 150, 151, 153, 181/155, 156, 199, 207, 208

[56] References Cited

U.S. PATENT DOCUMENTS

| | | | |
|---|---|---|---|
| 2,096,192 | 10/1937 | Moore | 181/153 |
| 3,326,321 | 6/1967 | Valuch | 181/156 |
| 3,819,005 | 6/1974 | Westlund | 181/155 |
| 3,819,006 | 6/1974 | Westlund | 181/155 |
| 4,356,881 | 11/1982 | Lowell | 181/156 X |
| 4,433,749 | 2/1984 | Watkins et al. | 181/199 X |
| 4,574,906 | 3/1986 | White et al. | 181/155 X |
| 4,596,305 | 6/1986 | Jagborn | 181/151 |
| 4,620,317 | 10/1986 | Anderson | 181/155 X |
| 4,802,551 | 2/1989 | Jacobsen | 181/199 X |
| 4,863,791 | 9/1989 | Steward et al. | 181/288 X |
| 4,863,792 | 9/1989 | Mrozinski | 428/315.5 |
| 4,907,671 | 3/1990 | Wiley | 181/156 |
| 4,957,184 | 9/1990 | Negishi | 181/153 |
| 4,964,482 | 10/1990 | Meyer | 181/151 X |
| 5,268,538 | 12/1993 | Queen | 181/153 X |

*Primary Examiner*—Khanh Dang
*Attorney, Agent, or Firm*—Skjerven, Morrill, MacPherson, Franklin & Friel; David E. Steuber

[57] ABSTRACT

An omnidirectional speaker system includes woofer and tweeter speakers mounted in a concave, curved upper housing fabricated of a relatively hard shell exterior and a foam interior, preferably plastic. Beneath the upper housing is a base, including a generally conical phase compensation plug which disperses the sound waves equally in all directions through a circumferential aperture between the upper housing and base. In a preferred embodiment, the cross-sectional shape of the upper housing is parabolic and the cross-sectional shape of the phase compensation plug is hyperbolic. A foam ring is attached to the exterior surface of the upper housing to prevent the formation of a sonic "hot spot" which can lead to a high intensity sonic beam objectionable to listeners.

5 Claims, 12 Drawing Sheets

OMNIDIRECTIONAL SPEAKER SYSTEM

This application is a continuation-in-part of application Ser. No. 08/093,296, filed Jul. 16, 1993, now U.S. Pat. No. 5,306,880, which was a continuation of application Ser. No. 07/720,314, filed Jun. 25, 1991, now abandoned.

FIELD OF THE INVENTION

This invention relates to omnidirectional speaker systems and, in particular, to such speaker systems which are weather-proof and theft-proof and therefore suitable for outdoor and marine uses. This invention also relates to omnidirectional indoor speaker systems which are mounted on a ceiling, wall or floor.

BACKGROUND OF THE INVENTION

The prior art has not provided an outdoor speaker system which projects a high-fidelity sound throughout a 360° angle in a horizontal plane; which is vandal, theft and weather-proof; and which is relatively inexpensive to manufacture. U.S. Pat. No. 4,574,906 to White et al. discloses an outdoor speaker which includes downwardly directed low-frequency (woofer) and high-frequency (tweeter) speaker cones and generates sound throughout a 360° horizontal angle. However, the speaker enclosure is fabricated with relatively thin plastic, and a sound absorbing material must be placed in the hollow cavity above the woofer to suppress any standing and reflective waves and reduce cabinet resonances. This adversely affects the quality and fidelity of the sound produced.

U.S. Pat. No. 3,326,321 to Valuch describes an omnidirectional speaker system with an upwardly facing tweeter and a downwardly facing woofer. Apart from separating the high-frequency and low-frequency sound waves in an undesirable manner, the speaker system is vulnerable to vandalism and weather and is therefore not suitable for outdoor use.

SUMMARY OF THE INVENTION

One embodiment of a speaker system according to this invention includes coaxially positioned, downwardly directed woofer and tweeter speakers which are mounted in an upper housing fabricated of a relatively hard shell exterior and a foam interior. The exterior shell is preferably manufactured of a relatively dense plastic with an interior consisting of a relatively porous, foamed plastic material. Beneath the coaxially mounted speakers is a base member including a tuned, cone-shaped "phase compensation plug" which provides uniform loading of the speaker diaphragm and disperses the sound waves equally in all directions through a circumferential aperture between the housing and the base member.

In this embodiment, the housing is supported on the base member by a plurality of vertical columns which are designed to resist disassembly. Furthermore, a metal screen or mesh is inserted into the aperture between the housing and base member so as to protect the interior of the speaker system from pilferage or damage from the outside. The plastic shell-foam composite from which the housing and base member are constructed is extremely rigid and can withstand a substantial blow without damage. The overall shape of the speaker enclosure protects the working elements of the speakers against damage from harsh weather conditions.

In one aspect of the invention, the cross-sectional shape of the cone on the base member is generally hyperbolic, and the cross-sectional shape of the upper housing is generally parabolic. In addition, a series of flutes is formed on the surface of the cone to aid in the deflection, mixing and alignment of high-frequency signals from the tweeter.

A speaker assembly in accordance with this invention may be anchored in the ground so as to prevent it from being stolen or otherwise removed.

In another embodiment of this invention, a speaker cabinet or enclosure of any size or shape is fabricated using a shell-foam composite of the above description. The result is an extremely durable, rigid and lightweight speaker cabinet which is less expensive to manufacture than a cabinet made of wood or metal, for example.

In yet another embodiment of this invention, an annular foam ring is attached to the outer surface of the upper housing near the circumferential aperture between the base member and the upper housing. The annular foam ring prevents the development of a sonic "hot spot" near a central point on the exterior surface of the housing.

DETAILED DESCRIPTION OF THE INVENTION

Figure 1:
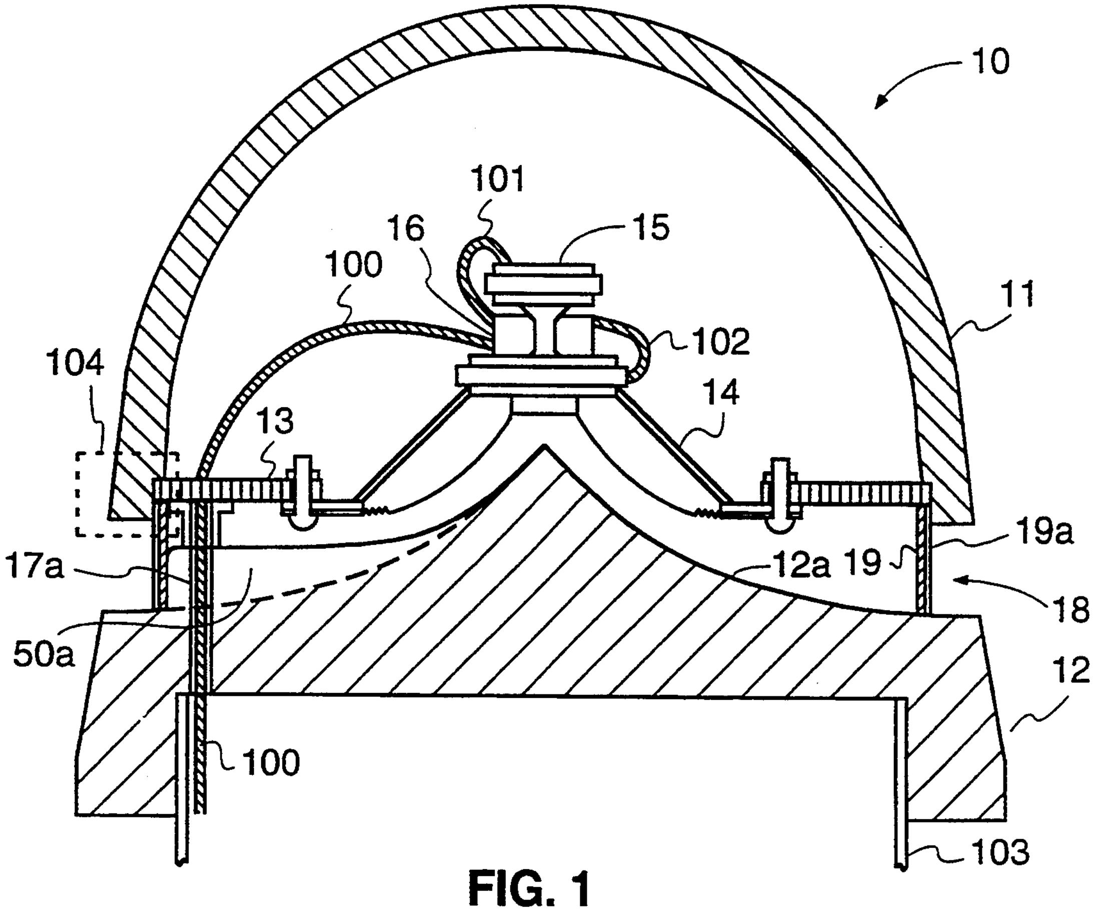
FIG. 1 is a vertical cross-sectional view of a speaker system in accordance with this invention.

FIG. 1 shows a vertical cross-sectional view of a speaker system 10 in accordance with the invention, including an upper housing 11 and a base 12. The inner surface of housing 11 is concave and preferably paraboloidal in shape. The upper surface of base 12 is a generally conical phase compensation plug 12*a*. Attached to the inside edge of housing 11 is an annular-shaped baffle 13 on which a low-frequency speaker (woofer) 14 is mounted in a conventional manner. Mounted coaxially on woofer 14 is a high-frequency speaker (tweeter) 15 which is connected electrically with woofer 14 by a crossover network 16. Baffle 13 is preferably made of an extremely rigid material such as Medex, manufactured by Medite Corporation of Medford, Oreg. The smooth concave inner surface of housing 11 focuses the sound waves emanating from the rear of speakers 14 and 15 and prevents the development of standing waves associated with speaker enclosures having parallel surfaces in the sound chamber.

Upper housing 11 is supported on base 12 by three metal tubes 17*a*, 17*b* and 17*c* (only tube 17*a* is visible in the cross-section of FIG. 1). Tubes 17*a*–17*c* are located at equal angles around the central axis of speaker system 10. Tubes 17*a*–17*c* separate housing 11 from base 12 so as to create an aperture 18 through which the sound waves emanate. A heavy-gauge metal mesh 19 is fitted into grooves (not shown) in housing 11 and base 12 so as to close aperture 18 to foreign objects while allowing the sound waves to pass out through aperture 18. An optional fiberglass or polypropylene screen 19*a* may be placed on the outside of metal mesh 19 to prevent insects from getting into the speaker system.

Baffle 13 may be ported in a manner known in the art to improve the base response of speaker system 10.

An incoming speaker wire 100 passes through base 12 and tube 17*a* and connects to crossover network 16. Wires 101 and 102 connect crossover network 16 to tweeter 15 and woofer 14, respectively. Alternatively, if a bi-amplification system is used, crossover network 16 may be omitted and separate incoming speaker wires may go directly to woofer 14 and tweeter 15. Speaker system 10 is mounted on a hollow column 103 which fits into a cavity on the bottom surface of base 12, as shown in FIG. 1.

Figure 2:
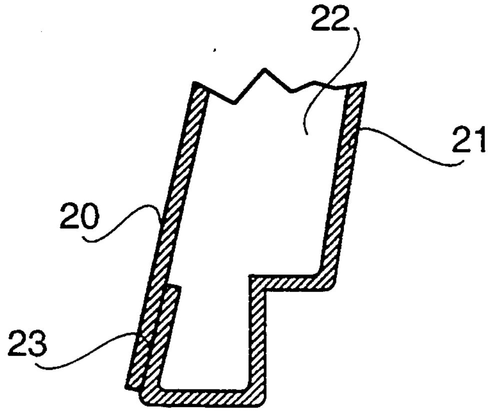
FIG. 2 is a detailed view of the shell-foam composite used in manufacturing a speaker system in accordance with this invention.

FIG. 2 shows in detail the structure of upper housing 11 in the region designated 104 in FIG. 1. The structure consists of an outer shell 20 and an inner shell 21 which surround a relatively light, semi-rigid, closed-cell foam core 22. Shells 20 and 21 are advantageously made of a monolithic ABS (acrylonitrile-butadiene-styrene), ultra-violet (UV) protected plastic. Alternatives include PVC (polyvinyl chloride) or other plastic compounds. PVC suffers from the disadvantage, however, that it is not as resistant to UV light as ABS. Core 22 preferably consists of a high-density urethane foam (4 lb., for example) which gives the structure rigidity against resonance at the frequencies generated by speakers 14 and 15 as well as strength against damage from vandals or thieves. Shells 20 and 21 are fitted together at a seam 23 as shown in FIG. 2. The exact configuration and number of shells used in fabricating the structure of housing 11 is not critical to the invention, provided that the overall shape shown in FIG. 1 is maintained.

Outer shell 20 and inner shell 21 are preferably manufactured by a vacuum-forming process, which involves heating a plastic sheet to be formed, draping it over a form, and then forming it by creating a vacuum between the sheet and the form. Other processes such as injection molding are also suitable. These processes are well known. After shells 20 and 21 are formed, they are sealed together (e.g., with a cement) at seam 23, and the volume between them is filled with a high-density plastic foam.

The structure shown in FIG. 2 has many advantages over other known methods of speaker cabinet construction. It costs less than, for example, wood, metal or fiberglass; it is lightweight; it can be designed into many different shapes and sizes; it has excellent structural integrity; and it is extremely resistant to resonance at audio frequencies. Base 12 is advantageously manufactured of a similar shell-foam composite.

Figure 3A:
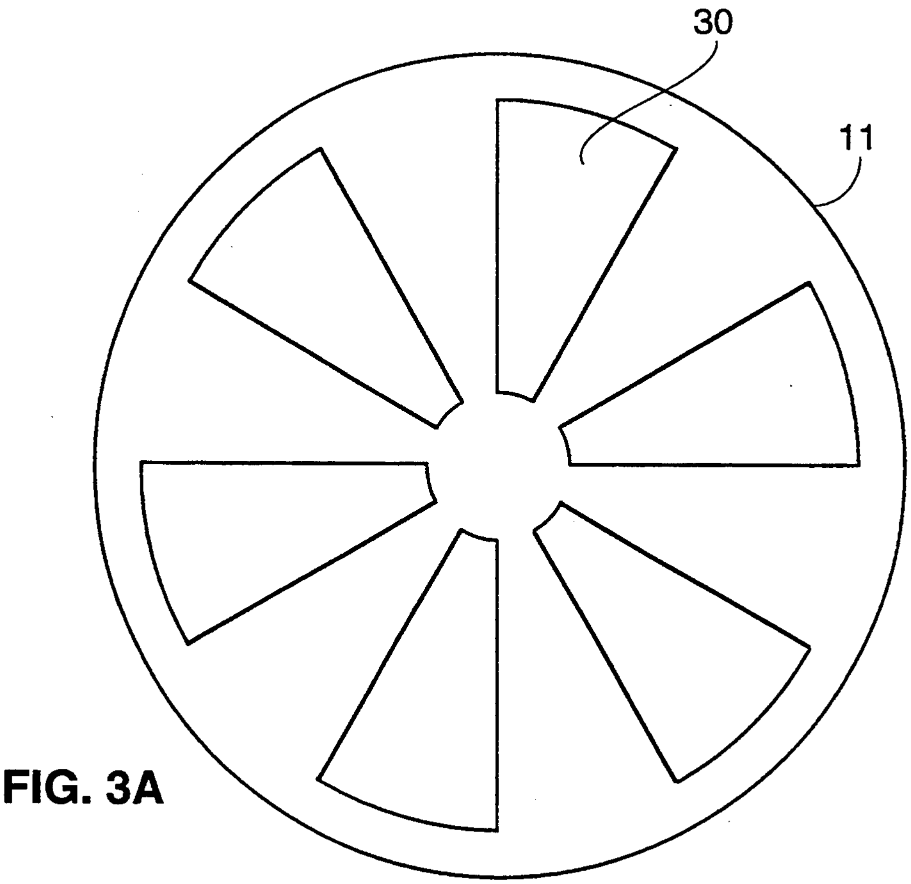
FIGS. 3A and 3B are top and bottom views, respectively, of the upper housing of the speaker system.
Figure 3B:
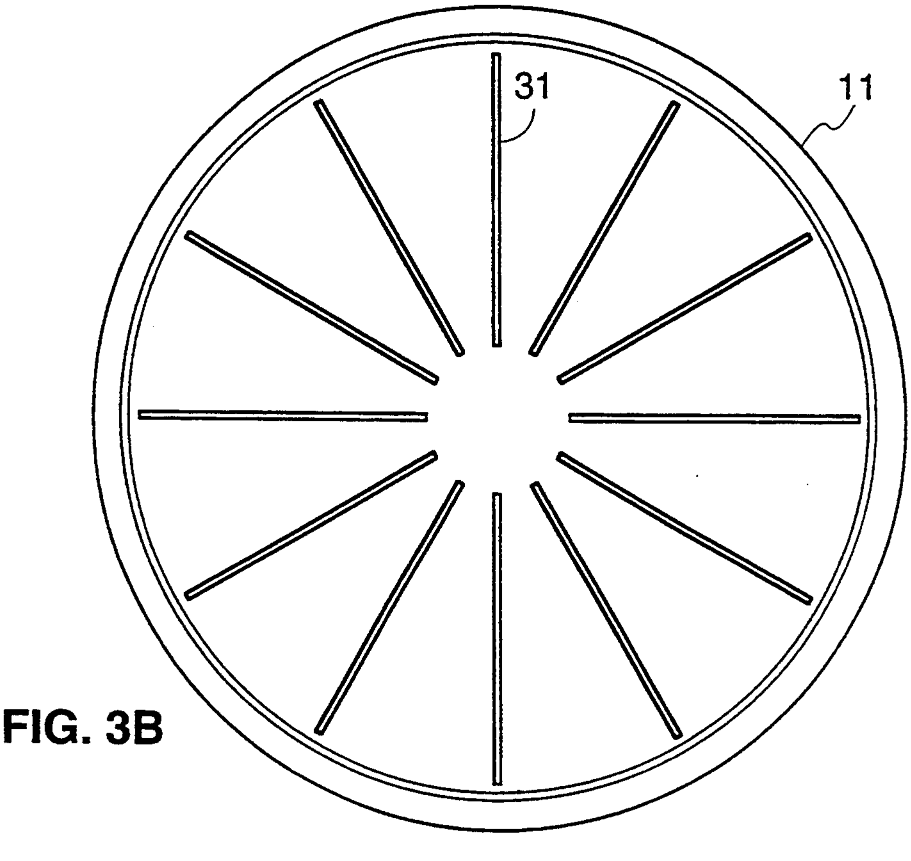

FIG. 3A and FIG. 3B show top and bottom views, respectively, of upper housing 11. FIG. 3A shows that the upper surface of housing 11 contains a series of indentations 30 which improve the appearance of the housing and add to its rigidity. Indentations 30 are approximately 0.5 inches deep. While FIG. 3A shows six indentations 30, either more or fewer indentations may be formed in housing 11.

FIG. 3B shows a series of radial ribs that are formed in the bottom (inside) surface of upper housing 11. Ribs 31 operate to provide still greater rigidity to housing 11, so as to give it greater resistance to resonance at the audio frequencies produced by speakers 14 and 15, particularly in the low-frequency to mid-frequency range (30–400 Hz) where resonance is a problem. Ribs 31 may advantageously be about 0.5 inches high and 0.5 inches wide. While twelve ribs 31 are shown in FIG. 3B, either more or fewer ribs may be formed into housing 11. It is not necessary that indentations 30 and ribs 31 line up in any particular fashion.

Figure 4:
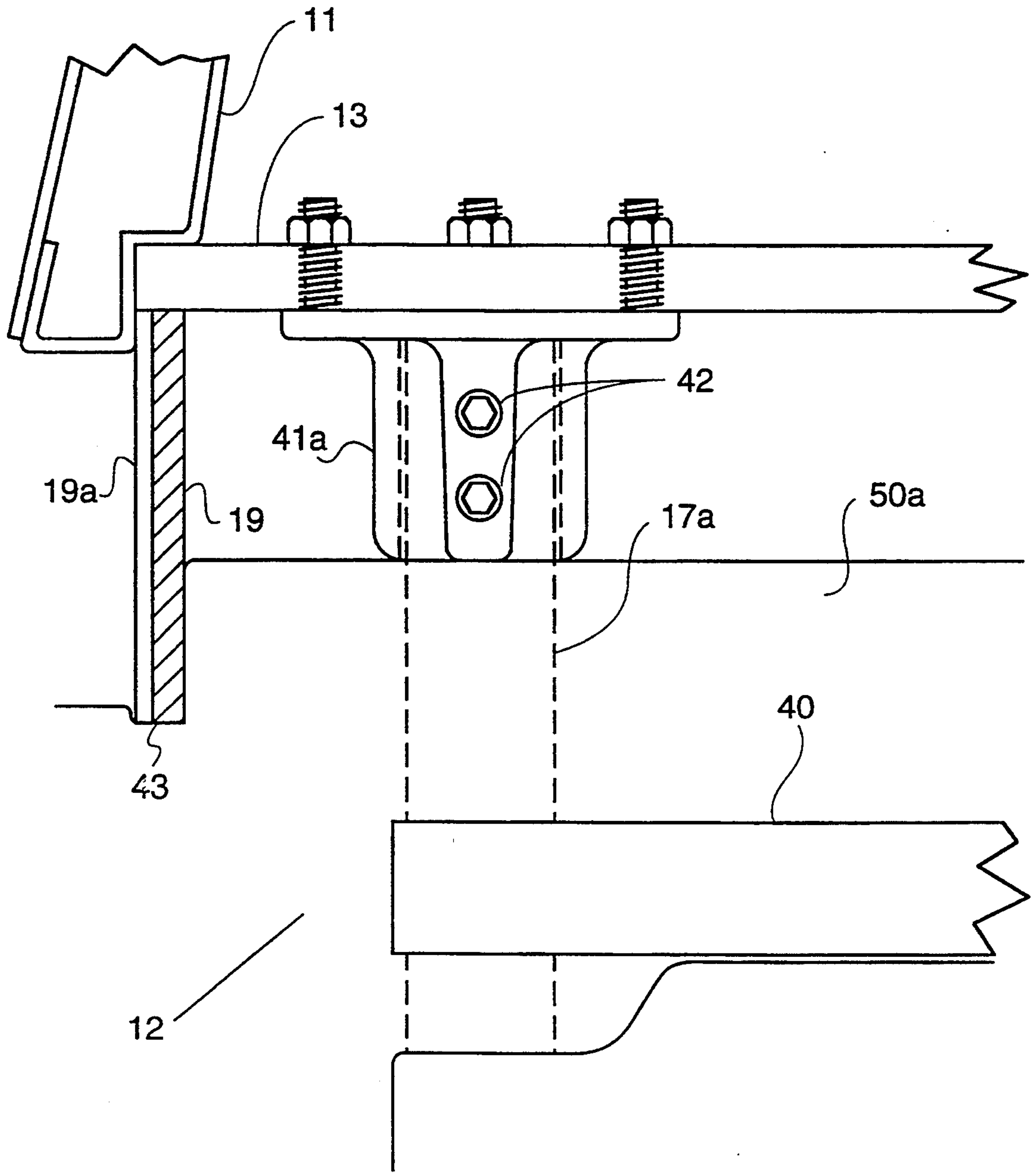
FIG. 4 is a detailed view of a tube member used to mount the upper housing onto the base member.
Figure 5:
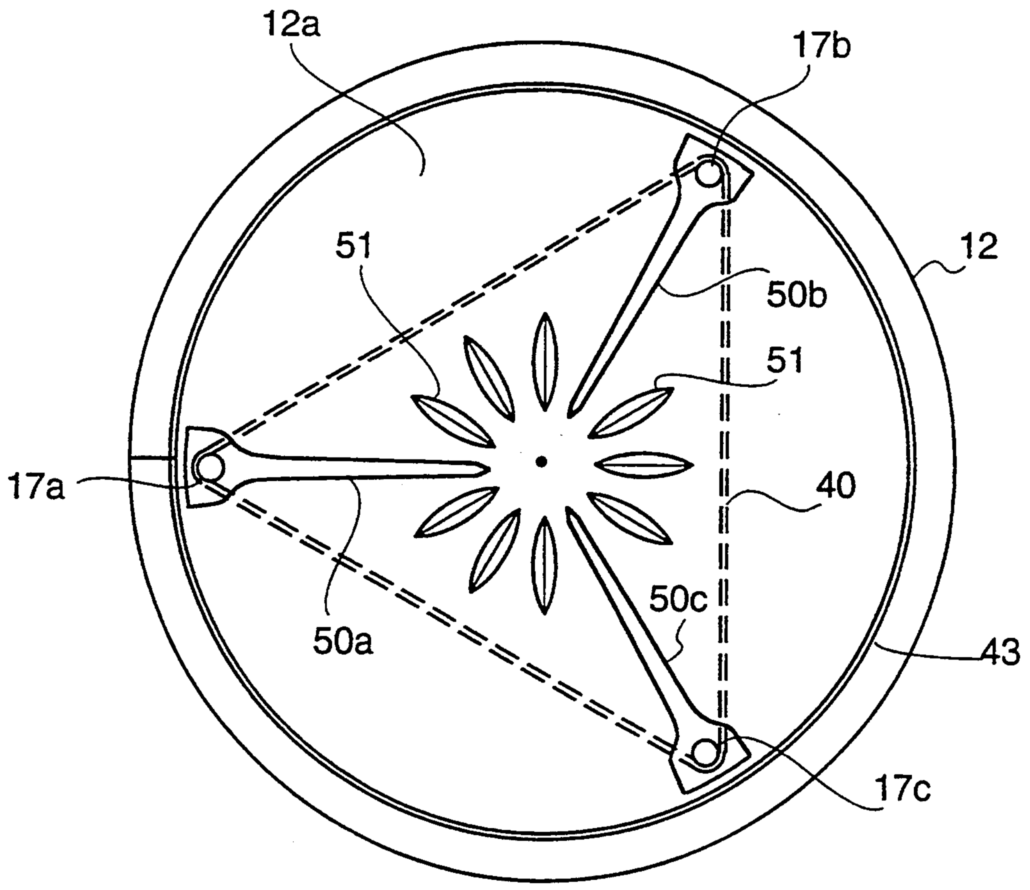
FIG. 5 is a plan view of the base member.

FIG. 4 shows in detail how upper housing 11 is supported over base 12 by tube 17*a*, which is attached to a flat bar frame 40. Frame 40 is formed in a triangular shape and welded or otherwise rigidly attached to the outside of tubes 17*a*–17*c* as shown in FIG. 5. Frame 40 may also be formed in another shape (e.g., a circle or a square) particularly where more than three tubes are used to support upper housing 11 on base 12. The assembly of tubes 17*a*–17*c* and frame 40 is properly positioned in base 12 before it is filled with foam, and thus the assembly becomes an integral part of base 12. Tubes 17*a*–17*c* extend a predetermined distance above the top surface of base 12 so as to provide a correctly-sized aperture 18 between housing 11 and base 12. Flanges 41*a*, 41*b* and 41*c* are mounted on baffle 13 and fit over the top ends of tubes 17*a*, 17*b* and 17*c*, respectively. Set screws 42 clamp flanges 41*a*–41*c* to tubes 17*a*–17*c*, respectively. As a precaution against theft, set screws 42 have heads which can be loosened only with special wrenches or other tools. In the embodiment of FIG. 4, set screws 42 can be loosened only with a "Torq" wrench which has been specially modified. Metal mesh 19 and polypropylene screen 19*a* are shown fitted into a groove 43 in base 12. Incoming speaker wire 100, which runs through tube 17*a* (as shown in FIG. 1), is preferably fitted with a connector in the region of flange 41*a* so that the speaker system can be disassembled for repairs or maintenance. When the set screws 42 on each of flanges 41*a*–41*c* are loosened, housing 11 may be lifted from base 12, and the connector may then be disengaged. One type of connector which has been found suitable for this purpose is a waterproof XLR audio connector.

FIG. 5 is a plan view of phase compensation plug 12*a*. Phase compensation plug 12*a*, which is generally a conical shape, contains fins 50*a*, 50*b* and 50*c* which extend outward from the center until they reach and surround tubes 17*a*, 17*b* and 17*c*. The purpose of fins 50*a*–50*c* is to guide the sound waves emanating from the center of the speaker system past tubes 17*a*–17*c* and thereby prevent the sound waves from being reflected back toward the center of the speaker system. A cross-sectional view of fin 50*a* is shown in FIG. 1.

Figure 6:
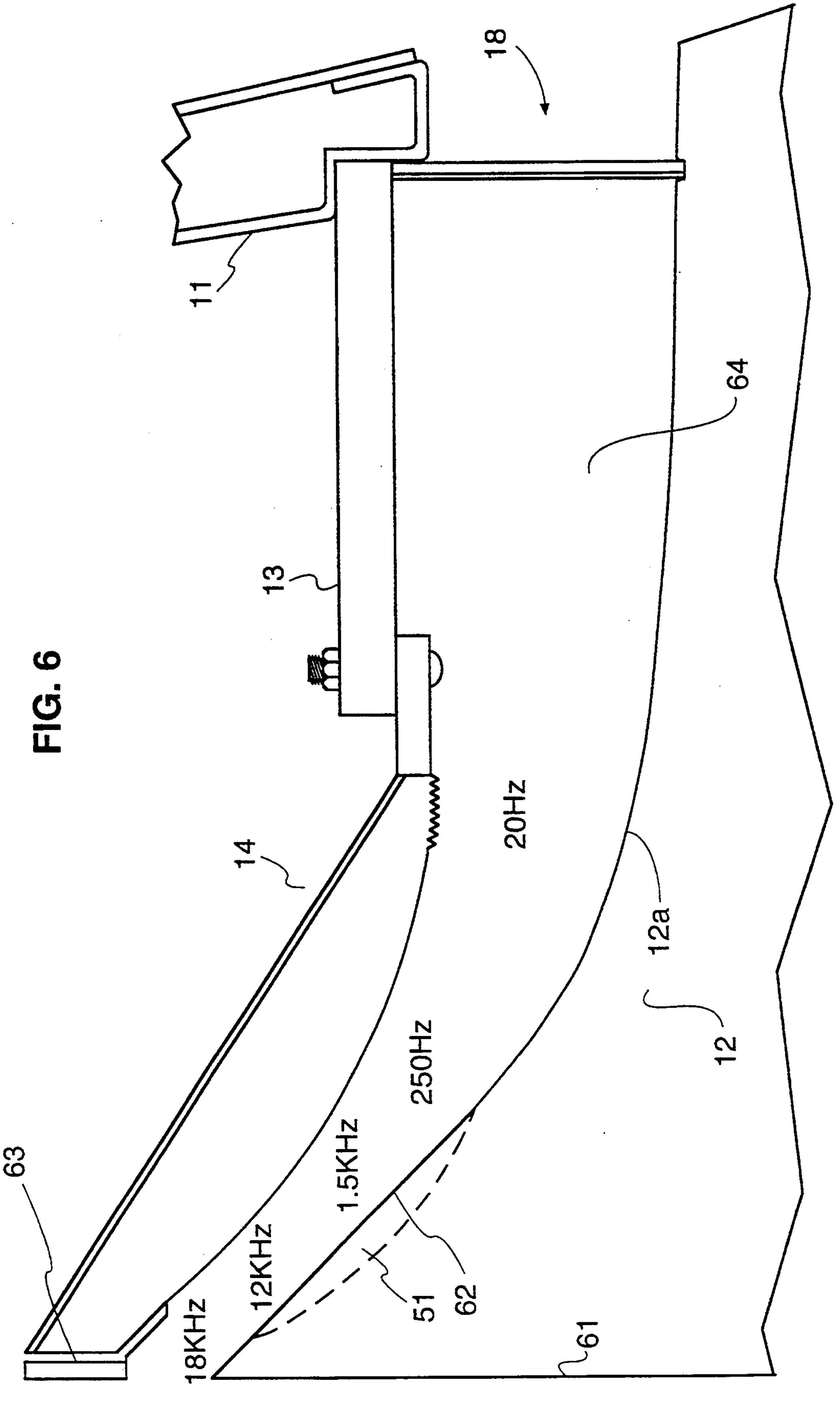
FIG. 6 is a detailed cross-sectional view of the surround plane manifold area, which includes the conical surface of the phase compensation plug and opposing speaker cone from the center line to the outside edge of the speaker system.

In addition, FIG. 5 shows a plurality of flutes 51 which extend radially outward from the center of the speaker system. A cross-section of one of flutes 51 is shown in FIG. 6. The general purpose of the cone-shaped phase compensation plug 12*a* is to reflect sound waves emanating downward from speakers 14 and 15 so that they are directed radially outward toward aperture 18. It has been found that flutes 51 function to force the high-frequency waves generated by tweeter 15 more quickly toward the outside of the speaker system and thereby aid in mixing them with the low- and mid-range frequencies generated by woofer 14.

This process is illustrated more clearly in FIG. 6, which is a cross-sectional view of an area referred to as the "surround plane manifold". This includes phase compensation plug 12*a* and speaker 14 from the center line of speaker system 10. A cross-sectional view of one of flutes 51 is shown. The center line of the speaker system is designated as 61. It has been found that the cross section of phase compensation plug 12*a* is preferably in the form of a straight line from center line 61 to about the point designated 62 in FIG. 6. From point 62 to aperture 18, the cross section of phase compensation plug 12*a* is preferably in the shape of a hyperbola. This results in an optimal deflection of the sound waves outward toward aperture 18.

FIG. 6 also shows a high-frequency driver port 63 through which high-frequency sound waves produced by tweeter 15 are conveyed, and a mixing manifold area 64 where sound waves of various frequencies are combined, time-aligned and mixed before they exit through aperture 18. Above phase compensation plug 12*a* are numbers indicating the approximate frequency of the sound waves produced in several regions. These frequencies range from 18 KHz adjacent high-frequency driver port 63, to 20 Hz at the outside circumference of speaker 14. In general, higher frequency waves are produced nearer to the center of the speaker system. The various frequencies are reflected from phase compensation plug 12*a* and directed into mixing manifold area 64 where they are combined and mixed before exiting through aperture 18. Flutes 51 provide a physical acceleration line for mixing of high-frequency and low-frequency signals in mixing manifold area 64. Without flutes 51, the high-frequency signals (above 4,000 Hz) tend to "hug" the surface of phase compensation plug 12*a* and are somewhat "late" in arriving at mixing manifold area 64, causing a phase or timing problem at aperture 18. Flutes 51 function to force the high-frequency signals into mixing manifold area 64 more quickly, and thereby provide for accurate time coherency when the sound leaves aperture 18. For a coaxial speaker having a 8–15 inch diameter woofer, the distance between the apex of phase compensation plug 12*a* and high-frequency driver port 63 should be in the range of 2.75–5.08 cm.

Figure 7:
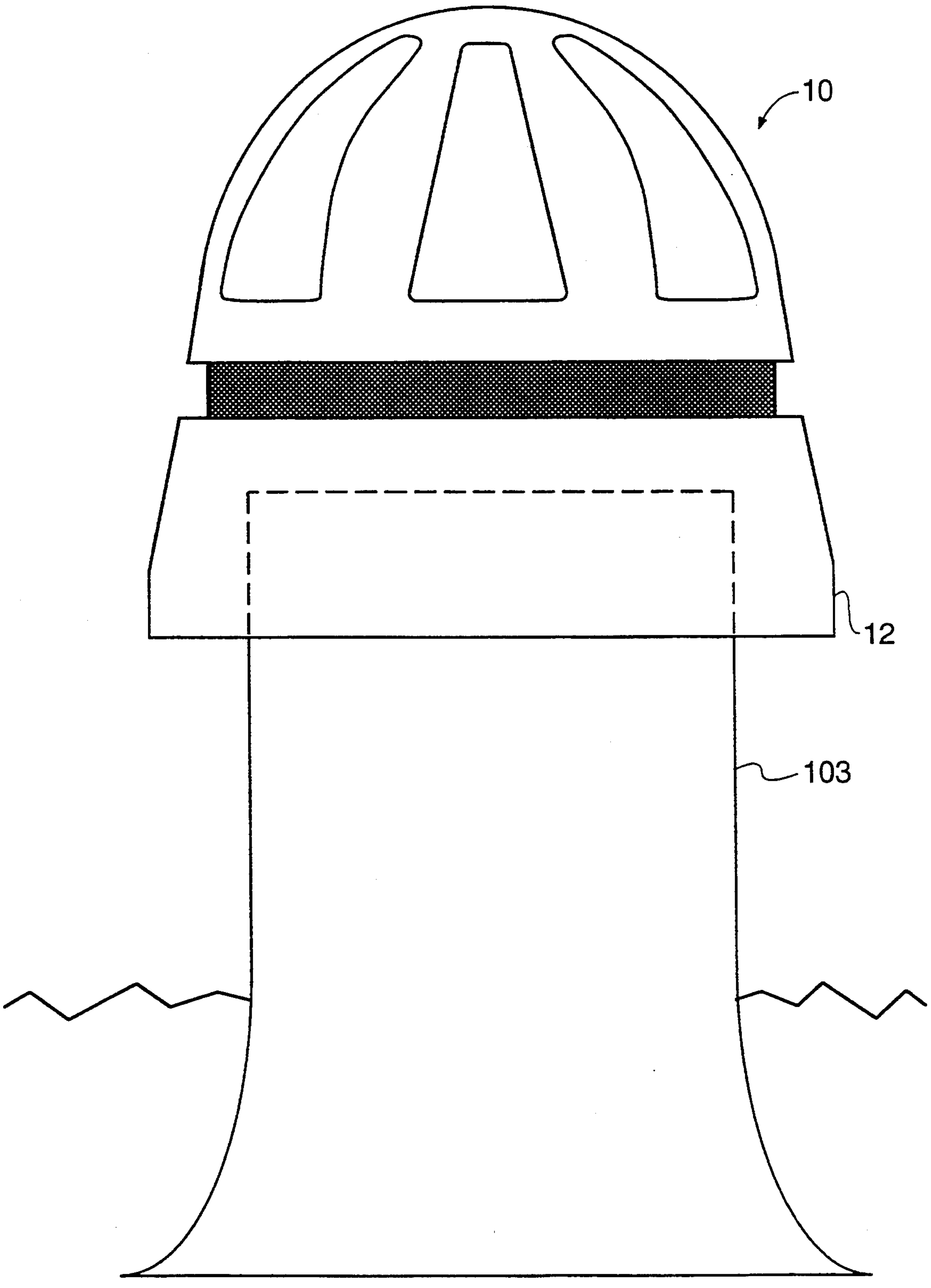
FIG. 7 is a side view of a speaker system in accordance with this invention, showing a method by which it may be anchored into the ground.

FIG. 7 shows a method of mounting speaker system 10 in an outdoor setting. Speaker system 10 is mounted on column 103, which is preferably a hollow bell-shaped ABS tube. Column 103 may be cemented into the lower cavity of base 12 and may be firmly anchored into the ground by submerging it approximately 2 feet. The flared lower edges of column 103 provide a firm anchor, since anyone who attempts to lift speaker system 10 out of the ground will be standing next to column 103 and will be pulling against his own weight. It will be apparent that a flange or lip arrangement can be substituted for bell-shaped column 103 and that speaker system 10 may be anchored into the ground in a variety of alternative ways.

Accordingly, what has been described is a speaker system which is ideally suited for outdoor and marine use. It is fabricated with a shell-foam composite which is extremely rigid and resistent to physical abuse. It is also resistent to temperature extremes, and the downward-opening concave shape of upper housing 11 protects the speakers from rain or snow. Any precipitation which falls on upper housing 11 or base 12 will drain toward the outside and will have no adverse effect on the interior components of the speaker system. Also, a speaker system according to this invention provides an extremely high quality of sound in all directions. This is due in part to the concave (preferably parabolic) shape of upper housing 11, which prevents standing waves from developing, and in part to the extremely rigid, non-resonant character of the composite material used in manufacturing the speaker system. The hyperbolic shape of phase compensation plug 12*a*, as well as the flutes 51 formed in the surface, provide an accurate mixture of high-, mid- and low-frequency sound waves.

In marine applications (e.g., on the foredeck of a small boat), the self-bailing feature of the speaker system is particularly important. Since the speakers themselves will normally be waterproof in these applications, rain or spray may be blown into the center of the system between the speaker cone and the phase compensation plug without damaging the unit. In this event, it is important that the speaker system drain properly. The outward sloping surfaces of the phase compensation plug ensure that this takes place.

Figure 8:
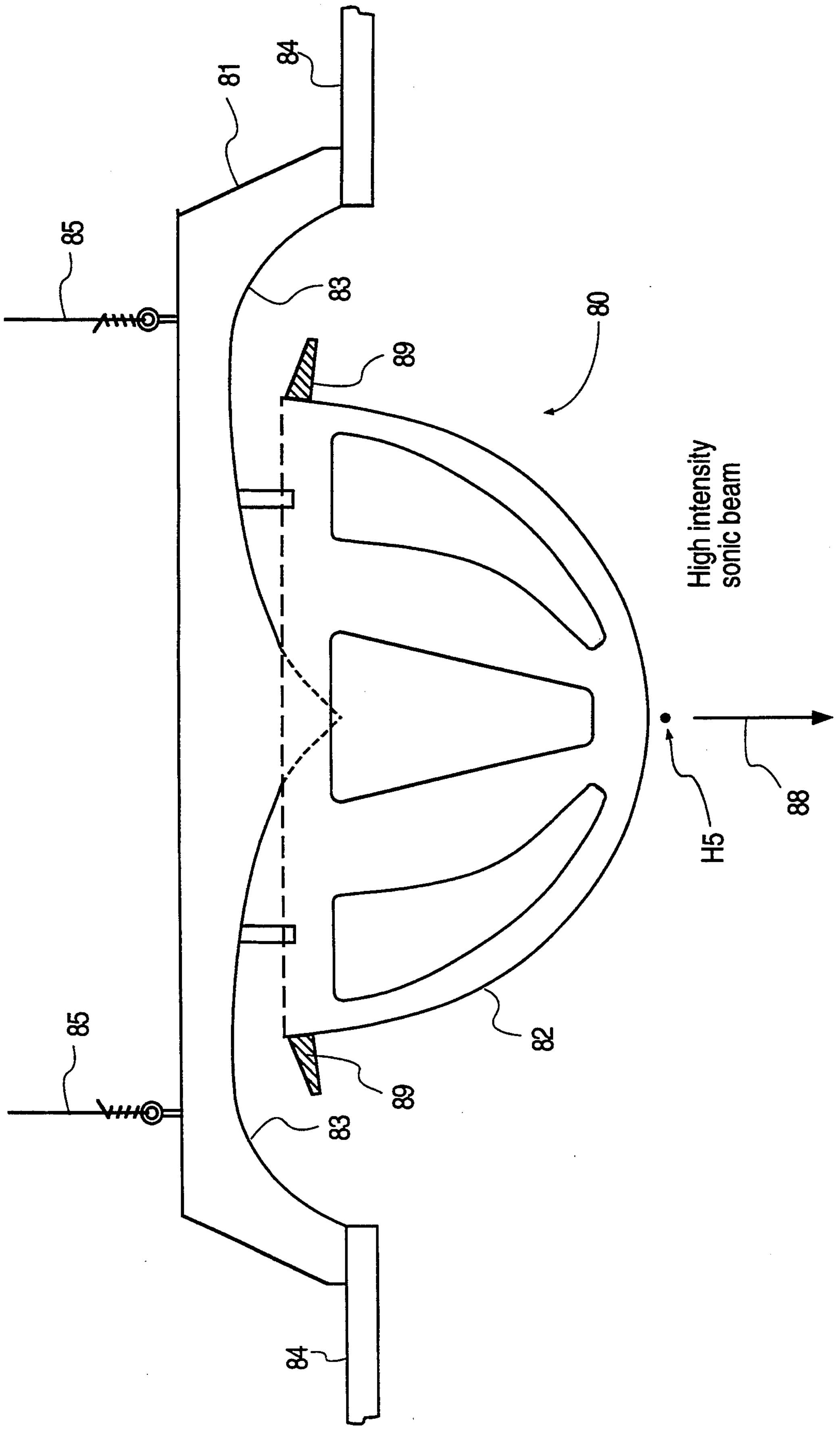
FIG. 8 is a elevational cross-sectional view of a ceiling-mounted speaker system in accordance with this invention.

FIG. 8 shows a ceiling-mounted speaker system 80 including a ceiling mount member 81 and a housing 82. Speaker system 80 is similar to speaker system shown in FIG. 1, except that ceiling mount member 81 is substituted for base 12. Ceiling mount member 81 may be attached to housing 82 in the same manner as base 12 is attached to housing 11. In the region adjacent to housing 82, the lower surface of ceiling mount member 81 has a phase compensation plug similar to that of base 12. Ceiling mount member 81 also has an outer deflection ring 83 which serves to direct the sound downward into the room.

Ceiling mount member 81 is mounted on the upper surface of a ceiling board 84, and it is suspended from a structural member of the ceiling by safety wires 85. Speaker system 80 may be mounted in a ceiling in the manner shown in FIG. 8, or in a variety of other ways which will be apparent to those in the art. As examples, ceiling mount number 81 could be attached to the lower surface of ceiling board 84, or it could be made to fit into the T-bar type of ceiling structure commonly used in office and commercial buildings. The speaker system of the invention may also be wall mounted to produce a unique audio effect.

Figure 9C:
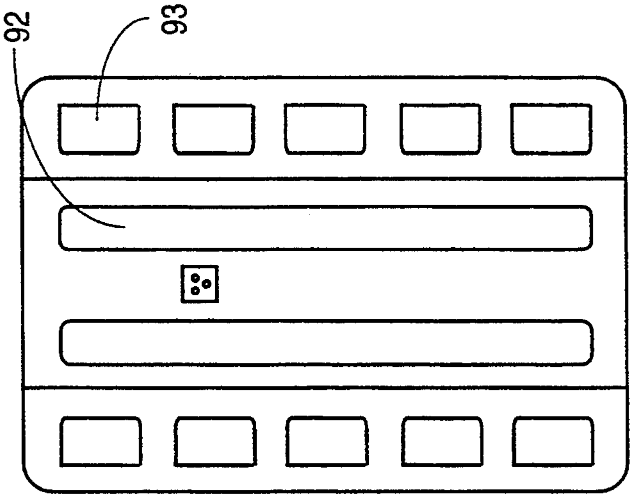
FIG. 9 shows a conventional box-shaped speaker enclosure manufactured from a shell-foam composite in accordance with an aspect of this invention.
Figure 9B:
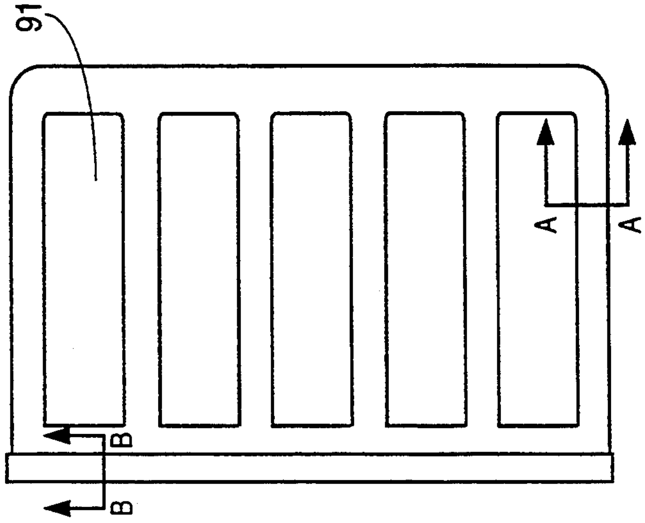
Figure 9D:
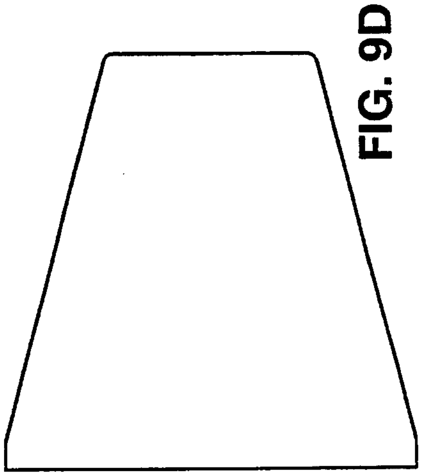
Figure 9A:
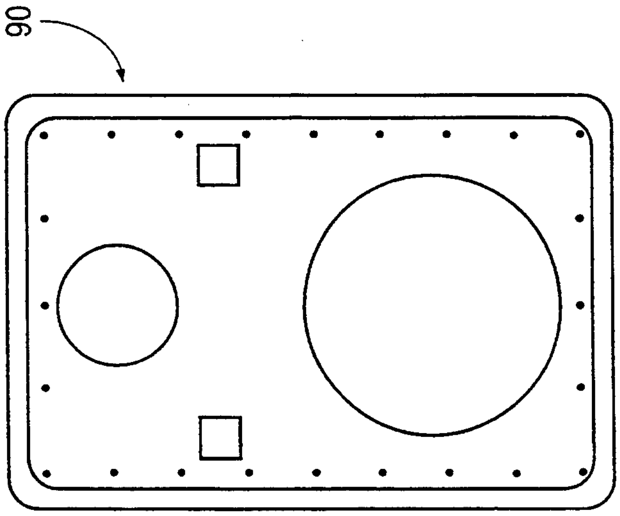
Figure 10:
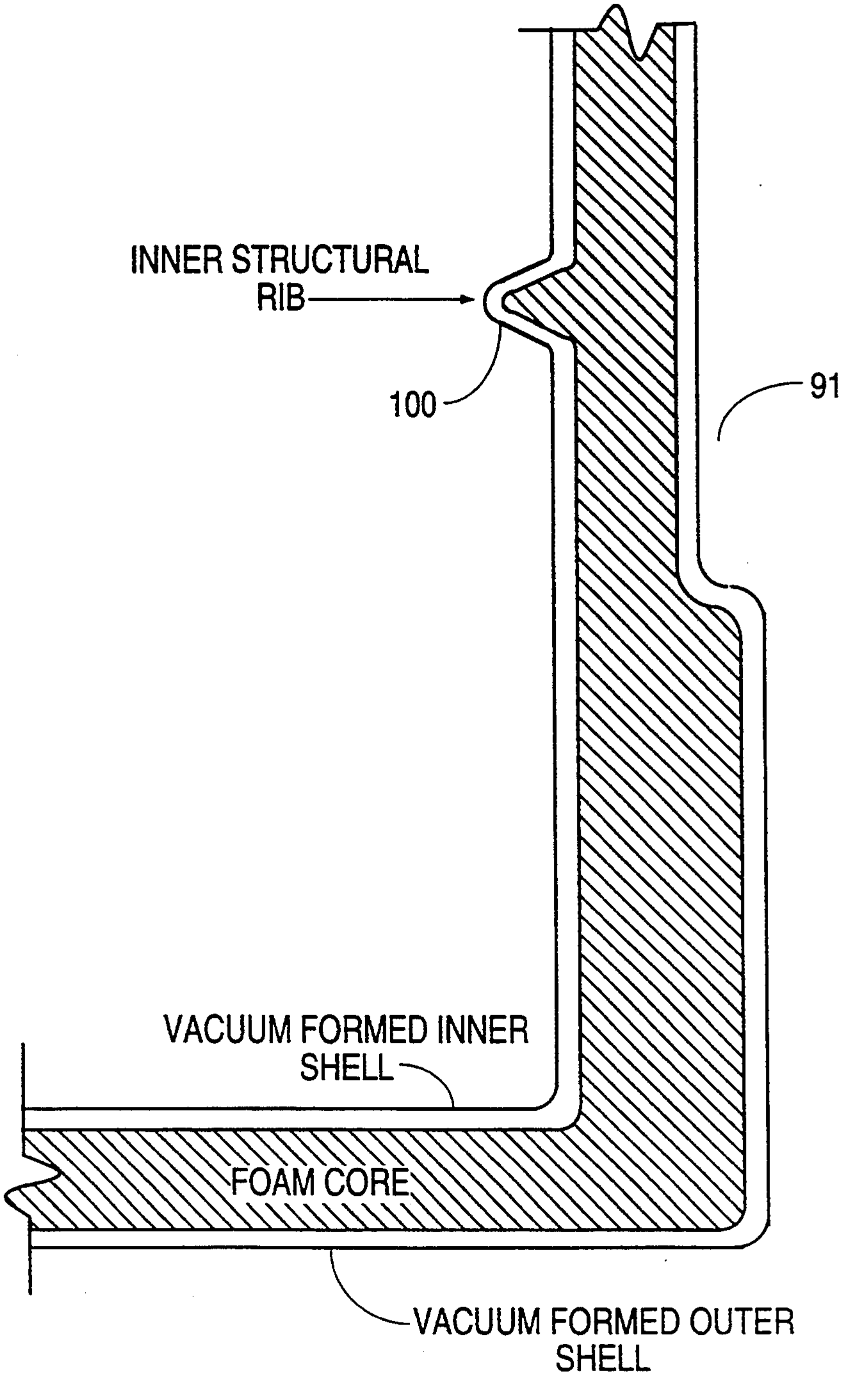
FIGS. 10 and 11 are cross sectional views of a portion of the speaker enclosure shown in FIG. 9.
Figure 11:
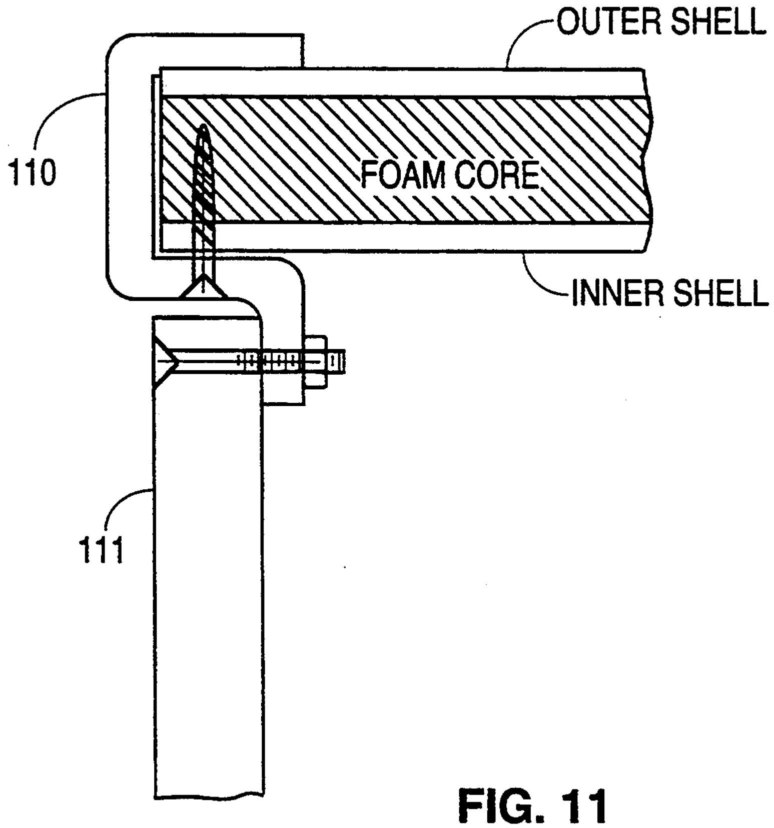

While the shell-foam composite shown in FIG. 2 is particularly suitable for manufacturing an omnidirectional outdoor speaker system, its utility is not so limited. Essentially any shape of speaker system can advantageously be manufactured using this type of construction, including the conventional box shape pictured in FIGS. 9A–9D. FIGS. 9A–9D show the front, side, rear and top views, respectively, of a generally box-shaped speaker enclosure 90. FIG. 9A shows the normal acoustical cloth or mesh covering the speaker cones. FIGS. 9B and 9C illustrate a pattern of indentations 91–93 which may be formed into the sides and rear of the enclosure to give it added rigidity and durability. Cross sections A—A and B—B are illustrated in FIGS. 10 and 11, respectively. In FIG. 10, an internal rib 100 gives the enclosure additional structural support. FIG. 11 illustrates a plastic vacuum-formed face ring 110 which is attached to the top, bottom and sides of enclosure 90 with screws and cement. A baffle 111 is bolted to face ring 110. The resulting enclosure 90 is extremely durable, impervious to abuse, resistant to resonance at audio frequencies, and relatively inexpensive to manufacture.

Figure 12:
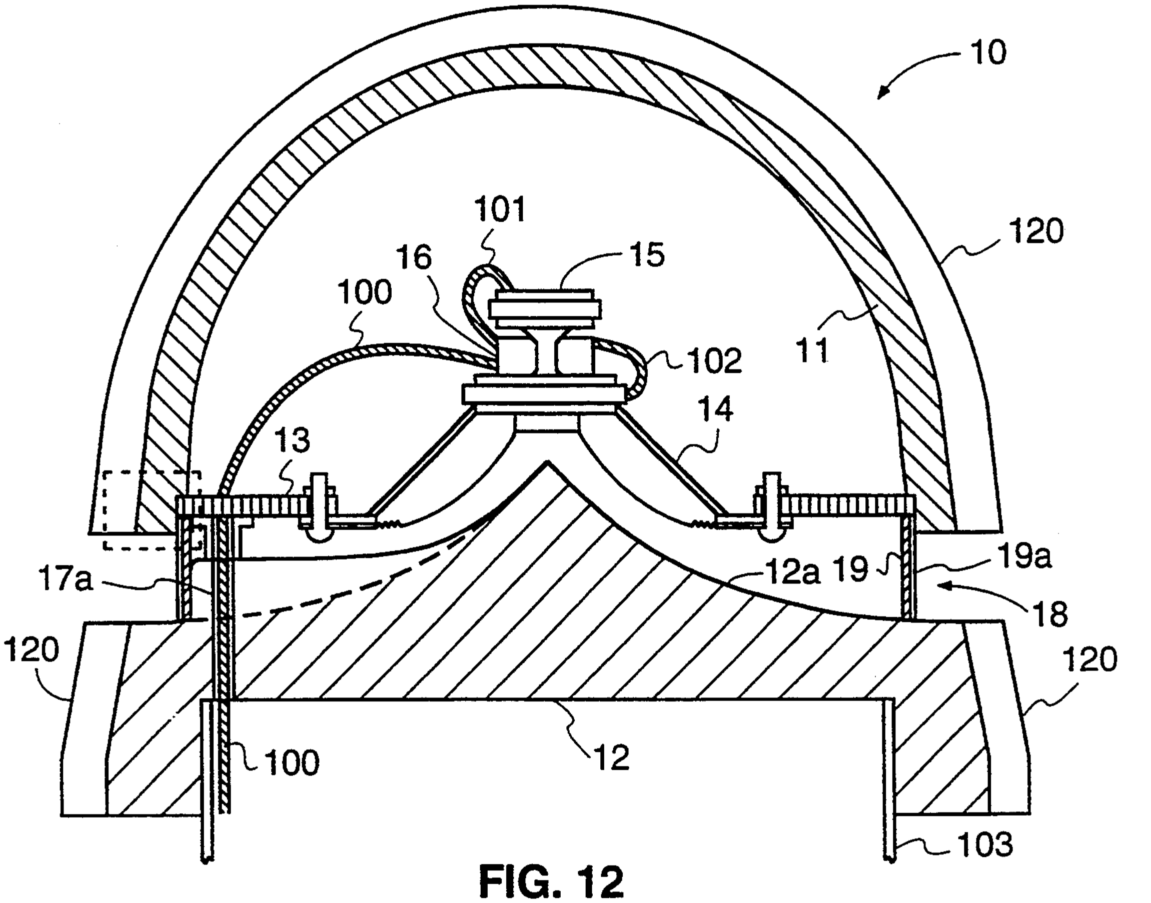
FIG. 12 is a cross-sectional view of a speaker enclosure which includes a protective outer sheath.

The speaker system of this invention may be manufactured to fit inside an outer sheath or casing formed of a wide variety of structural and architectural materials, so as to protect the speaker system from weather and physical abuse (e.g., vandalism) and harmonize in virtually any indoor or outdoor setting. FIG. 12 illustrates speaker 10 with a protective outer sheath 120 bonded to the outside surface of housing 11 and base 12. Examples of such materials include epoxy/aggregates, tile, plastics, wood, and various types of simulated stone materials such as stucco stone and durastone.

It has been found that frequencies in the range of from 900–15,000 Hz tend to migrate along the exterior surface of the housing to form a sonic "hot spot" at a central location on the exterior of the housing. Referring to FIG. 8, the hot spot is shown as a point designated HS. The presence of a sonic hot spot at this point leads to the creation of a high intensity sonic beam which propagates outward along the central axis of the speaker. This is denoted by arrow 88 in FIG. 8. This high intensity sonic beam can be annoying to persons who are situated in its path. For example, if the speaker is ceiling mounted, as shown in FIG. 8, persons situated directly below the sonic hot spot may experience significant discomfort from the high intensity sonic beam. It has been found that the sound pressure level at the hot spot may be as much as 10 dB higher than the sound pressure level at other locations outside the housing.

This problem may be alleviated by attaching a foam ring 89 to the outside of housing 82, at a location near the aperture from which the sound waves emanate. Preferably, foam ring 89 is fabricated of a medium-to-high density UV-protected foam. A polypropylene foam is preferred, but other materials, such as polyurethane foam or expanded styrene foam, may also be used for foam ring 89.

Figure 13:
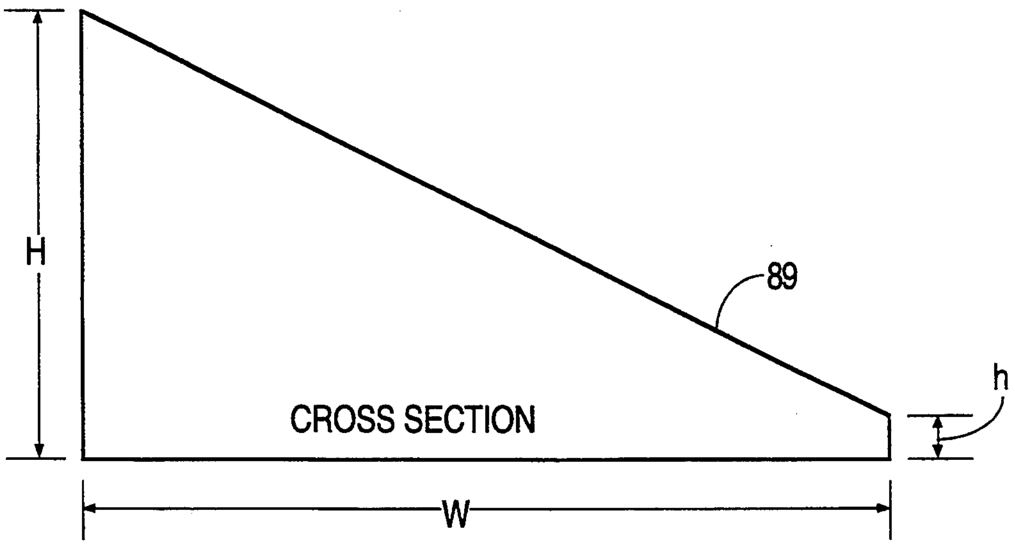
FIG. 13 illustrates a cross-sectional view of a foam ring which may be used to prevent the development of a sonic "hot spot" on the exterior of the housing.

In the preferred embodiment, foam ring 89 has a cross section as illustrated in FIG. 13. For a speaker housing having a radius of $13\frac{1}{8}$ inches, a foam ring having a dimension W=4 inches, a dimension H=2 inches and a dimension h=3/16 inches has been found satisfactory. The foam ring may be provided with an adhesive strip on the H leg so that it may be easily installed in the field.

The embodiments described above should be viewed as illustrative and not limiting of the broad scope of this invention. Numerous other and alternative embodiments will be apparent to those skilled in the art.

I claim:

1. An omnidirectional speaker system comprising:

a concave, dome-shaped housing;

a base having a generally conical outer surface;

a speaker mounted within said housing and directed toward said generally conical surface;

means for mounting said housing on said base so as to form a circumferential aperture between said housing and said base; and a foam ring attached to an exterior surface of said housing at a location near said circumferential aperture.

2. The speaker system of claim 1 wherein said foam ring is a four-sided figure in cross section, said four-sided figure having a shortest leg which is substantially shorter than the other legs of said four-sided figure and a next shortest leg which is attached to the surface of said housing.

3. The speaker system of claim 1 wherein said foam ring comprises a medium-to-high density foam.

4. The speaker system of claim 1 wherein a cross section of said foam ring is wedge-shaped.

5. The speaker system of claim 1 said speaker system being ceiling-mounted, with said speaker being directed upward.

* * * * *